United States Patent [19]

Sullivan et al.

[11] Patent Number: 4,980,586

[45] Date of Patent: Dec. 25, 1990

[54] DIGITAL INTEGRATED CIRCUIT PROPAGATION DELAY REGULATOR

[75] Inventors: Steven K. Sullivan, Beaverton; Donald F. Murray, St. Helens, both of Oreg.

[73] Assignee: Tektronix, Inc., Beaverton, Oreg.

[21] Appl. No.: 106,102

[22] Filed: Oct. 7, 1987

[51] Int. Cl.[5] .............. H03K 5/159; G01K 7/00; H02H 7/20; H05B 1/02

[52] U.S. Cl. .................. 307/591; 307/595; 307/602; 307/310; 328/3; 328/11; 328/55; 219/497

[58] Field of Search .............. 307/591, 592, 595, 602, 307/310; 328/3, 11, 55, 58; 361/93, 94, 97, 98, 101; 219/497; 324/73 R; 331/69, 70

[56] References Cited

U.S. PATENT DOCUMENTS

| | | | |
|---|---|---|---|
| 3,614,480 | 10/1971 | Berglund | 307/303 |
| 3,735,270 | 5/1973 | Holub | 328/58 |
| 3,743,930 | 7/1973 | Fathauer | 328/3 |
| 4,257,061 | 3/1981 | Chapek, Jr. et al. | 357/69 |
| 4,374,316 | 2/1983 | Inamori et al. | 357/80 |
| 4,392,105 | 7/1973 | McLeod | 324/73 R |
| 4,473,762 | 9/1984 | Iwahashi et al. | 307/591 |
| 4,641,048 | 2/1987 | Pollock | 307/597 |
| 4,758,740 | 7/1988 | Wilhelm et al. | 307/310 |

Primary Examiner—Stanley D. Miller
Assistant Examiner—Trong Quang Phan
Attorney, Agent, or Firm—David P. Petersen

[57] ABSTRACT

In accordance with the present invention, a heater is included on an integrated circuit, together with a circuit for controlling the heater to selectively heat the integrated circuit and control the propagation delay time of signals passing through the integrated circuit. In a specific form of the invention, the propagation delay time of signals passing through at least a portion of an integrated circuit is measured and compared with a reference propagation delay time. The heater is controlled to increase the heat it produces when the measured propagation delay time is less than the reference propagation delay time. In addition, the heater is controlled to decrease the heat it provides when the measured propagation delay time is greater than the reference propagation delay time.

20 Claims, 3 Drawing Sheets

DIGITAL INTEGRATED CIRCUIT PROPAGATION DELAY REGULATOR

TECHNICAL FIELD

The present invention relates to digital integrated circuits in general, and in particular to a circuit for controlling or regulating the signal propagation delay time of circuits or logic elements on an integrated circuit using temperature.

BACKGROUND OF THE INVENTION

Signal propagation delay time is the time it takes a pulse to pass through a logic element or combination of logic elements and other circuit components on an integrated circuit. Although the delay time is usually fairly uniform among logic elements and components on the same integrated circuit, the delay time for all of the circuit components on an integrated circuit can vary with operating temperature. In addition, in some logic systems, as for instance in many emitter-coupled logic element arrangements, propagation delay time is dependent, within limits, on bias signals applied to one or more transistors in the arrangement. In many applications, such bias signals are typically fixed and do not vary during operation of the integrated circuit.

Though circuit designers often seek to minimize propagation delay time, in some applications it is equally important that delay time be consistent and predictable.

U.S. Pat. No. 4,641,048 of Pollock represents one approach for controlling integrated circuit propagation delay time. In Pollock, a phase locked ring oscillator is incorporated into the integrated circuit to be controlled. The oscillator includes a number of representative logic elements of the type wherein the propagation delay time through the elements are in part a function of an applied bias signal. The output of the ring oscillator ($V_p$) is compared by a bias signal generator with a known reference signal ($V_{ref}$). The bias signal generator produces a bias signal ($V_b$) proportional to the time integral of the phase difference between $V_p$ and $V_{ref}$. This variable bias signal $V_b$ is applied to all of the logic elements in the ring oscillator and to all controlled logic elements on the integrated circuit. As described in this patent, the bias signals are varied in a manner that maintains the propagation delay time through the ring oscillator at a substantially constant level. Since the same bias signal is applied to all other controlled logic elements on the integrated circuit, some control of the propagation delay times through the integrated circuit as a whole is also achieved.

The approach of varying bias signals to control propagation delay time has a number of limitations. For example, it has no affect on delay times through circuit elements in which delay time is not a function of an applied bias signal. In addition, it is not practical for use in connection with CMOS integrated circuits because of limitations on bias voltages in such circuits.

It is known that integrated circuits, such as CMOS circuits, exhibit propagation delay characteristics which vary with the temperature of the integrated circuit. In the past, integrated circuits have been placed in ovens with a temperature sensor coupled to the circuit. The temperature of the oven is then adjusted to maintain the oven temperature and, at least in theory, the temperature of the integrated circuit at a stable level. This approach is relatively expensive to implement and becomes impractical for devices which include many integrated circuits.

Therefore, a need exists for an improved means for regulating propagation delay time of signals passing through an integrated circuit, and more specifically for an improved means using heat to regulate propagation delay times.

SUMMARY OF THE INVENTION

In accordance with the present invention, a heater is included on the integrated circuit, together with means for controlling the heater to selectively heat the integrated circuit to control the propagation delay time of signals passing through the integrated circuit. Alternately, cooling mechanisms on integrated circuits may be used in the same manner.

As a more specific aspect of one implementation of the present invention, the signal propagation delay time of signals passing through at least a portion of an integrated circuit is measured and compared with a reference propagation delay time. A heater is controlled to increase the heat it produces when the measured propagation delay time is less than the reference propagation delay time. In addition, the heater is controlled to decrease the heat it produces when the measured propagation delay time is greater than the reference propagation delay time.

In accordance with a specific implementation of the present invention, a test signal from a test signal source is applied to a ring oscillator comprised of logic elements having propagation delay characteristics which are typical of other logic elements on the integrated circuit. The oscillator output comprises a string of pulses of a frequency which is a function of the propagation delay time of signals passing through the oscillator, propagation delay time being in part a function of the temperature of the integrated circuit. A frequency counter receives a stored reference delay or frequency value at the start of each test signal. The reference frequency value is decremented by the frequency counter in response to each pulse from the oscillator during the test signal. A frequency counter output signal is produced by the frequency counter and corresponds to the value to which the reference frequency value is decremented at the end of each test signal. A heater counter stores an initial heater value which is incremented and decremented between limits in response to the frequency counter output signal. The heater counter produces a heater control signal output which corresponds to the value to which the initial heater value has been incremented and decremented. The heater control signal in turn controls the operation of the heater to generate an appropriate amount of heat to regulate the propagation delay. Both the initial heater value and reference frequency value may be adjusted.

As another more specific aspect of the invention, the heater comprises plural integrated circuit heat generating elements, such as MOS transistors with different channel widths, which generate heat when energized. The heater control signal controls which of the heat generating elements are energized and thereby controls the heat generated by the heater.

The test signals may be of a uniform duration. Alternately, the duration of the test signals may be varied to optimize the control of the heater. By varying the duration of the test signals, a compensation can be made for lag time required for the ring oscillator to reach a stable temperature after a change in heat produced by the heater.

It is therefore an object of the present invention to provide an improved circuit for heating an integrated circuit in a controlled manner to adjust the propagation delay time of signals passing through the integrated circuit.

It is still another object of the present invention to provide such a circuit which is relatively inexpensive and which is capable of being fabricated for the most part as a portion of the integrated circuit in which propagation delay is to be controlled.

These and other objects, features and advantages of the present invention will become apparent with reference to the following detailed description and drawings.

DETAILED DESCRIPTION OF THE PREFERRED EMBODIMENT

The present invention has an application to any situation in which it is desired to maintain propagation delays of signals passing through an integrated circuit at a substantially constant and invariant level.

One specific application in which the maintenance of constant propagation delay time is important involves the testing of integrated circuits. For example, in FIG. 1, an integrated circuit 10 is subject to test. Typically, a plurality of drivers 12, for example 256 such drivers for a 256-pin integrated circuit, are used to apply signals to the integrated circuit 10. Output comparators 14 are used to compare the outputs at pins of the integrated circuit 10 resulting from the applied signals to known responses. This information is used to verify whether integrated circuit 10 is properly functioning. One such integrated circuit testing device incorporating drivers and comparators is the LT-1000 test system available from Tektronix, Inc., of Beaverton, Oreg.

Figures 1, 2, 4:
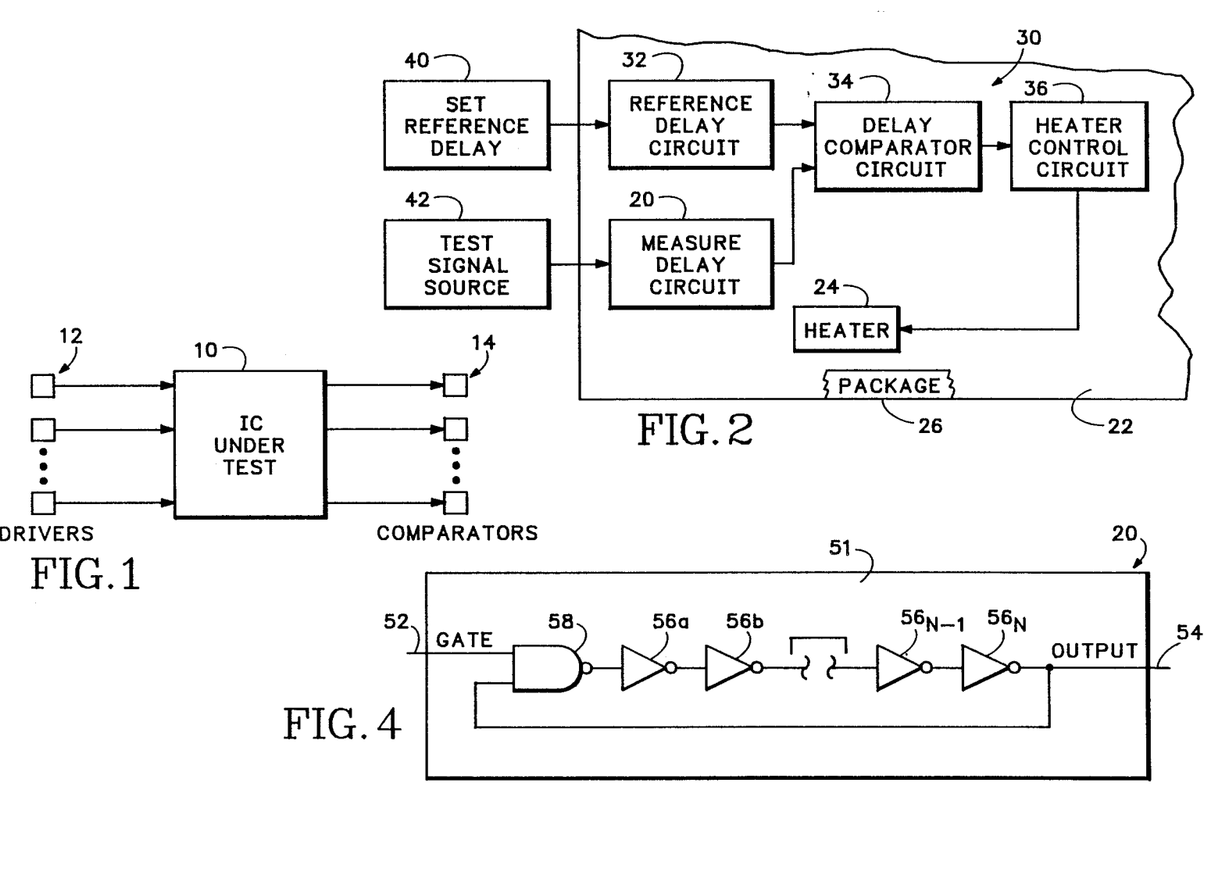
FIG. 1 is a block diagram showing one application of integrated circuits incorporating the present invention.
FIG. 2 is a block diagram of a preferred embodiment of the present invention.
FIG. 4 is a schematic diagram of a form of ring oscillator used in the embodiment of FIG. 3.

The drivers 12 and comparators 14 each typically comprise an integrated circuit. Changes in the temperature and supply voltage of these drivers and comparators can occur during their operation. For example, temperature changes can arise from ambient temperature changes and from changes in power being dissipated by the integrated circuits. These changes can cause unwanted changes in the time it takes signals to pass through the drivers and comparator integrated circuits. Since some of these signals are used to perform propagation delay measurements on the integrated circuit 10 under test, variations in the propagation delay through the drivers 12 or comparators 14 cause errors in these time measurements.

To improve the consistency of propagation delay times through integrated circuits, a circuit in accordance with the invention is added to each integrated circuit in which such control is desired. This added circuit includes means for monitoring the propagation delay of one portion of the integrated circuit. The circuit of the present invention also includes means for changing the temperature of the integrated circuit die in order to maintain the propagation delay times at a substantially constant level.

In general, as shown in FIG. 2, a measure delay circuit 20 is included on the integrated circuit die 22 which contains the integrated circuit for which propagation delay time is to be regulated. Because measure delay circuit 20 is on the integrated circuit die, propagation delay time through circuit 20 is affected by temperature variations of die 22 to substantially the same extent as other circuits on the die.

A heater 24 is thermally coupled to die 22 for selectively heating the die to vary the propagation delay time. Preferably, heater 24 is comprised of integrated circuit heat generating elements which are fabricated on die 22 during the fabrication of other circuits on the die. Also, heater 24 is typically positioned on the die at a location which is relatively close to measure delay circuit 20. This minimizes the time lag required for changes in heat from heater 24 to reach and change the temperature of measure delay circuit 20. The integrated circuit die 22, and a metallic metal lead frame typically used with the circuit die, are relatively thermally conductive so as to conduct heat generated by the heater 24 to the rest of the die. Also, a relatively thermally insulating package 26, typically of plastic or ceramic is positioned around the die. Package 26 allows the die temperature to be elevated relative to the ambient temperature.

Thus, because all of the circuits on a die are in close proximity and are fabricated with relatively thermally conductive materials, circuits throughout the die remain at nearly the same temperature. Also, factors, such as temperature and voltage, that alter the propagation delay time of one circuit on the die, are nearly the same for all circuits on the same die. Therefore, it is possible to regulate the propagation delay time in all circuits by measuring the propagation delay time in any circuit, such as circuit 20, and using that information in controlling the temperature of the die.

In particular, a control circuit indicated generally at 30 responds to measured propagation delay time information from circuit 20 and controls heater 24. As the measured delay drops relative to a desired level, heater 24 is controlled to produce additional heat. Conversely, as the measured delay rises relative to a desired level, the heat from heater 24 is reduced. In this way, propagation delay time is controlled to an extremely high degree.

With continued reference to FIG. 2, the illustrated embodiment includes a reference delay circuit 32 for providing a reference delay signal corresponding to a desired propagation delay. A delay comparator circuit 34 compares the reference delay signal from circuit 32 with a measure delay signal from circuit 20. The output from comparator circuit 34 corresponds to the difference between the desired delay and the actually measured delay. This comparator output signal is transmitted to a heater control circuit 36 which generates a heater control signal corresponding to the difference between the reference and measured delay signals.

Heater 24 is controlled by the heater control signal to either adjust or maintain the heat it produces, depending upon the relationship between the reference delay and measure delay signals. A set reference delay circuit 40, which may comprise a microprocessor, can be used to establish and vary the desired reference delay signal. In addition, as explained below, the illustrated measure delay circuit 20 measures the propagation delay in response to test signals from a test signal source 42.

Figure 3:
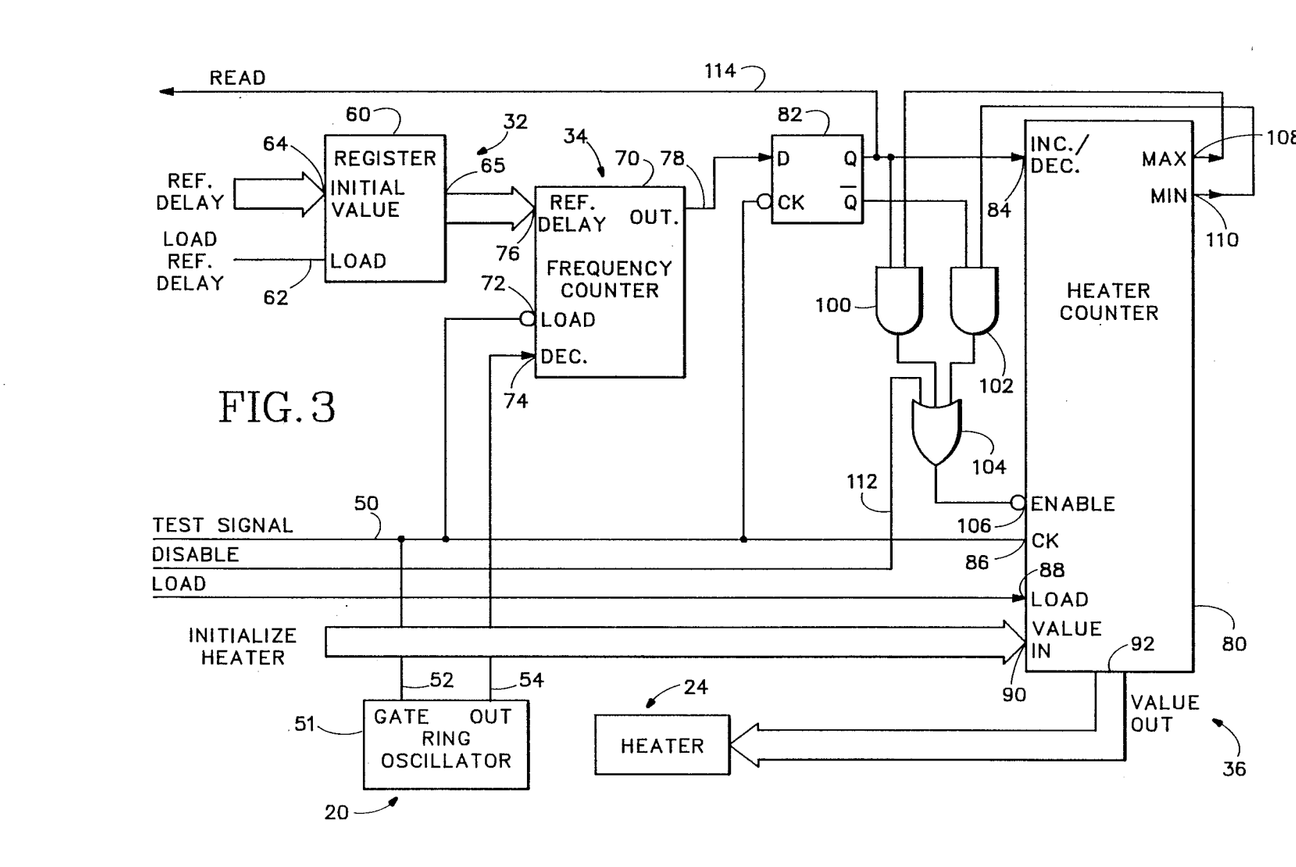
FIG. 3 is a schematic diagram, partially in block form, of the embodiment of FIG. 2.
Figure 6:
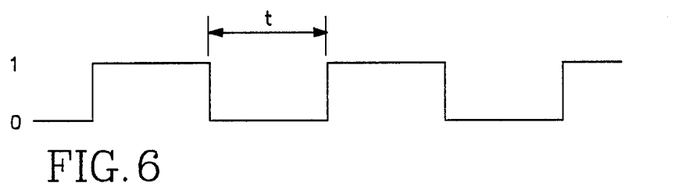
FIG. 6 illustrates exemplary test signals used in the FIG. 3 embodiment.

As shown in FIG. 3, one form of measure delay circuit 20 comprises a ring oscillator 51. An accurate reference or test signal from test signal source 42 is transmitted on a line 50 to a gate input 52 of the ring oscillator. The test signal is a repetitive digital wave form, such as of the type shown in FIGS. 6 and 7. The test signal remains at a high logic level for a time t in FIG. 6. This time is long enough for the ring oscillator to generate many pulses at an output 54 thereof.

Referring to FIG. 4, the ring oscillator includes N logic elements, in this case, a NAND gate followed by an even number of inverters, connected in series with the output of a preceding inverter being connected to the input of the next inverter. The output of the Nth inverter comprises the ring oscillator output 54. This latter output of the Nth converter is also connected to a first input of a NAND gate 58. Gate 58 has another input which comprises the gate input 52 of the oscillator. The logic elements comprising the oscillator circuit have propagation delay characteristics which are typical of the other logic elements on the integrated circuit.

Figure 7:
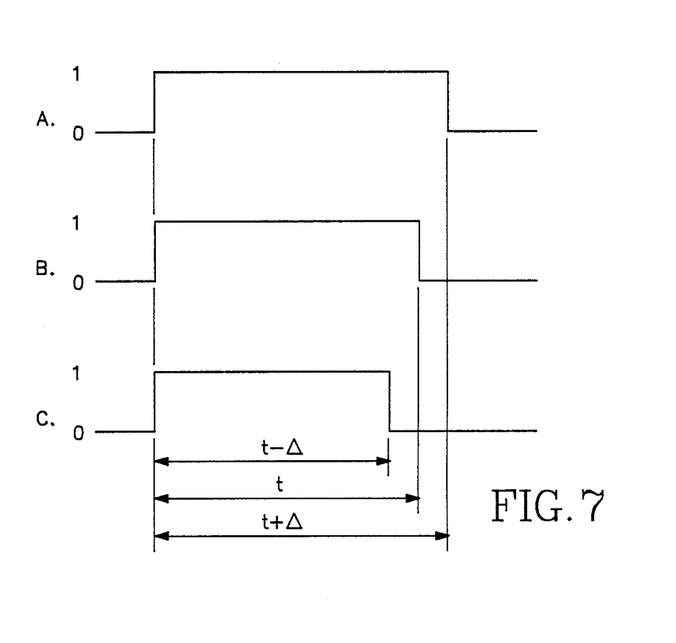
FIG. 7 illustrates still other test signals used in the embodiment of FIG. 3.

With this construction, during the time a high logic level test signal is applied to gate 52, the oscillator produces a delay measuring output signal. This oscillator output signal is comprised of pulses of a frequency which is a function of the propagation delay of the logic elements forming the oscillator. In addition, this propagation delay is in part a function of the temperature of the integrated circuit die 22 (FIG. 7). That is, when the delay in the ring oscillator 51 becomes less, the pulses oscillator output 54 are at a higher frequency in comparison to the case where the propagation delay time is higher. In addition, by increasing the temperature of the integrated circuit die 22, the propagation delay time in the oscillator 51 increases. This increase in propagation delay time causes the output pulses at output 54 to occur at a lower frequency. In contrast, if the integrated circuit die 22 is allowed to cool, the propagation delay time in the ring oscillator decreases and the frequency of pulses at output 54 increases.

The reference delay circuit 32 (FIG. 3) comprises a storage means such as a twelve-bit desired frequency register 60. In a response to a load reference delay signal at a load input 62 of register 60, an initial reference delay value, in binary form, is loaded into register 60 at a twelve bit initial value input 64. This initial value is determined as explained below and may be varied as desired simply by placing a different value into register 60.

The illustrated delay comparator circuit 34 comprises a twelve bit frequency counter 70 having a load input 72 connected to test signal line 50, a count input 74 connected to output 54 of ring oscillator 51, and a reference delay input 76 coupled to a twelve-bit output 65 of register 60. When the test signal on line 50 goes to a logic high level, the twelve-bit reference delay value stored in register 60 is loaded from output 65 through input 76 and into frequency counter 70.

Each pulse from the ring oscillator output 54 is used to cause the frequency counter 70 to count. In one approach, the frequency counter 70 is set to zero at the start of each reference pulse. In this case, the count in the frequency counter 70 at the time the test signal goes to a low logic level is a measure of the propagation delay time in ring oscillator 51. For example, a greater propagation delay in the ring oscillator results in a smaller number remaining in the frequency counter. Although the above approach may be used in the illustrated embodiment, the frequency counter 70 is not set to zero at the start of each reference pulse. Instead, frequency counter 70 is set to a reference frequency value. This reference frequency value is obtained from register 60 and corresponds to the number of times it is desired that the frequency counter 70 counts during each test signal. In addition, counter 70 is designed to decrement from this initial value, rather than increment. At the end of the test signal, that is, when the test signal drops to a logic low level, ring oscillator 51 stops generating pulses. In addition, the number or value remaining in frequency counter 70 at the end of the test signal is the difference between the desired or reference number of counts and the actual or measured number of counts.

If the propagation delay time in the integrated circuit is too small, the ring oscillator will produce output pulses at a higher frequency than desired. This in turn causes the frequency counter 70 to be decremented to a negative number before the end of the test pulse. When the frequency counter 70 contains a negative twos complement number, the most signficant bit of the frequency counter is a logic one. The most significant bit is coupled to the output 78 of the frequency counter. As explained below, when this occurs, the heater 24 is operated to increase the temperature of the integrated circuit die 22 (FIG. 1) and cause all of the propagation delays to increase. In comparison, if the propagation delays are too large, the number remaining in frequency counter 70 at the end of the test signal will be positive. A positive number at this time indicates that the frequency of pulses from ring oscillator 51 is too low. When the frequency counter contains a positive number, the most significant bit of the frequency counter and output 78 is a logic zero. This information is used to cause a decrease in heat from heater 24. When heat from the heater is reduced, the temperature of the integrated circuit die drops and all of the propagation delays decrease.

The illustrated heater control circuit 36 includes an eight bit heater counter 80 together with a D flip-flop 82. The D input of flip-flop 82 is connected to the output 78 of frequency counter 70. Also, the Q output of flip-flop 82 is connected to an increment/decrement input 84 of heater counter 80. In addition, the test signal on line 50 is fed to a clocking input 86 of the heater counter and is inverted and fed to a clocking input of flip-flop 82. In response to a load signal at an input 88 of the heater counter, an eight bit binary initial heater value is loaded into the heater counter at an input 90. Also, an eight bit heater control signal is delivered from heater counter 80 at an output 92. This heater control signal comprises the current value of the initial heater value as incremented and decremented by signals at input 84 of the heater counter. The initial heater value can be varied, but is typically selected at a level resulting in a heater control signal that causes heater 24 to produce heat in a mid-range of its capabilities.

At the beginning of each test signal, as the frequency counter 70 is being loaded from register 60, the heater counter 80 is caused to count. The value in the heater counter is incremented if the frequency counter output 78 is a logic one. In this case, the signal clocked through flip-flop 82 to the Q output of the flip-flop and to input 84 of the heater counter is positive. Conversely, the heater counter value is decremented if the frequency counter output at 78 is a logic one. As explained below, the output value at 92 from the heater counter controls how much heat is dissipated by heater circuit 24. Larger numbers in the heater counter cause more heat to be dissipated by the heater circuit and correspondingly increase the propagation delay time.

Figure 5:
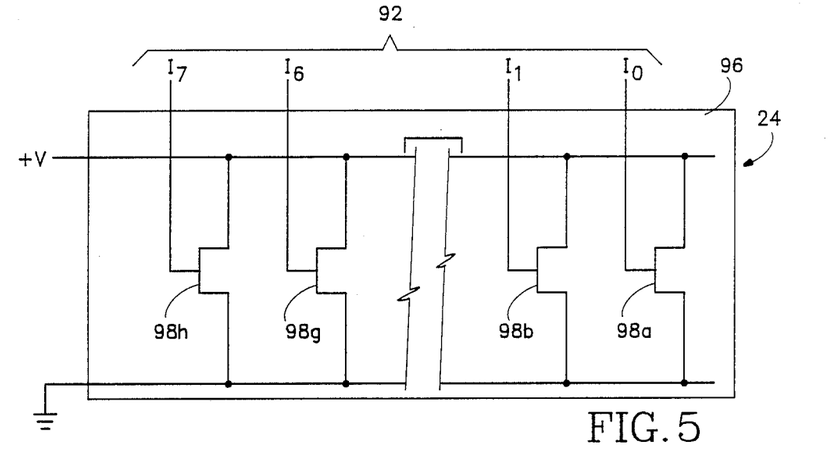
FIG. 5 is an electrical schematic diagram of a form of heater used in the embodiment of FIG. 3.

The heater 24 may take the form of a heater circuit 96 which is shown in FIG. 5. This heater circuit comprises a plurality of integrated circuit heat generating elements which dissipate heat when energized. These heat generating elements comprise MOS transistors (four of which are shown in FIG. 5 and numbered as 98a, 98b, 98g and 98h), one for each bit of output 92 of the heater counter. The gates of these transistors are coupled to the respective bits of the heater counter while the drain and source of each transistor is connected between a positive voltage supply and ground potential. When connected in this manner, different numbers in the heater counter cause current to flow through different combinations of transistors. Each of the transistors 98a–98h has a different channel width, with the transistor connected to the most significant bit of the heater counter 80 having the largest channel. As a specific example, if the width of the channel of the first transistor 98a may be X, the channel width of the second transistor may be 2X, the channel width of the third transistor 4X, the channel width of the fourth transistor 8X, the channel width of the fifth transistor 16X, the channel width of the sixth transistor 32X, the channel width of the seventh transistor 64X, and the channel width of the eighth transistor 128X. The sizes of these transistors are thus designed so that the transistor controlled by each bit of the heater counter, from the most significant bit to the least significant bit, switches one-half the current of the preceding transistor. In this way, the number in the heater counter linearly controls the amount of current flowing through the heater. The heat that is dissipated by the heater circuit 96 is the product of the current flowing through the heater and the supply voltage.

To prevent abnormal modes of operation, the illustrated heater counter is prevented from incrementing when it has reached a maximum value and decrementing when it has reached a minimum value. In the illustrated FIG. 3 circuit, this is accomplished by a pair of AND gates 100, 102 with their respective outputs connected to inputs of an OR gate 104. The output of OR gate 104 is inverted and fed to an enable input 106 of the heater counter. Also, AND gate 100 has as its inputs the Q output of flip-flop 82 and a maximum value output (MAX) 108 from heater counter 80. In addition, AND gate 102 has its inputs coupled to the $\overline{Q}$ output of flip-flop 82 and to a minimum value output (MIN) 110 of the heater counter. In the event heater counter 80 reaches its maximum count, a high logic level signal is delivered at MAX output 108 to AND gate 100. If the next signal from the Q output of flip-flop 82 is also a logic one, AND gate 100 delivers a high logic signal to OR gate 104. This causes OR gate 104 to produce a high logic level output signal which, when inverted and applied to enable input 106, disables heater counter 80 from incrementing. Heater counter 80 is disabled in this manner until such time as the output of flip-flop 82 is at a level which causes the heater counter to decrement its count. In contrast, if heater counter 80 is at its minimum value, a high logic level signal from MIN output 110 of the heater counter is applied to AND gate 102. In this case, when the $\overline{Q}$ output of flip-flop 82 is a logic one, corresponding to the Q output attempting to decrement the count in heater counter 80, AND gate 102 produces a high logic level output signal. In response, the output of OR gate 104 is positive and, when inverted and applied to input 106, disables the heater counter from decrementing. In this way, the heater counter 80 is constrained to count upwardly and downwardly between limits.

For reasons explained below, a high logic level disable signal may be selectively applied on a line 112 to an input of OR gate 104. In response to this disable signal, heater counter 80 is inhibited from either incrementing or decrementing. In addition, the Q output from flip-flop 82 may be read via a line 114 to monitor the state of the flip-flop and thus the output of frequency counter 70. The disable signal on line 112 and monitoring of the flip-flop 82 on line 114 take place during initialization of the circuit as explained below.

In order for the entire circuit to work properly, it is important that the test signals do not arrive too rapidly. If a large number of test signal pulses arrive before a temperature rise caused by an increase in heat from heater 24 propagates through the die 22 to the ring oscillator 51, the heater counter 80 may be either incremented or decremented many times beyond an equilibrium value. When this happens, the values in the heater counter 80 oscillates between very large numbers and very small numbers. A small amount of oscillation is acceptable, but large oscillations may have undesirable side effects.

To reduce the size of the oscillations, the frequency of the test signals can be reduced. In other words, the duration t of high level portions of the test signals shown in FIG. 6 may be increased. This allows time for small temperature changes to propagate through the integrated circuit die 22, including the ring oscillator 51, before many test signals arrive. Also, by positioning heater 24 close to ring oscillator 51, the propagation of temperature changes is enhanced. Although uniform width test signals are satisfactory in many applications, the approach of reducing the frequency of test signals has the disadvantage of making the entire circuit slow to respond to changes in propogation delay. Again, propogation delay may result from die temperature change due to a change in power dissipation in various other circuits on the integrated circuit, changes in supply voltages, or other factors.

One approach for increasing the response of the circuit to propogation delay changes without accompanying large oscillations, involves the use of test signals of varying duration. That is, the length of time t that a test signal is high is varied. By making some test signals longer, some shorter, and a few test signals with a width halfway in between, the slew rate of the heater counter 80 can be varied for varying conditions. For example, test signals of the form shown in FIGS. 7a, 7b, and 7c may be used. As shown in FIG. 7, test signal 7b is at a high logic level for a time t, test signal 7a is at a high logic level for a time t plus a small difference a, and test signal C is at a high logic level for a time t minus a. Typically, a stream of test signals comprised of many signals of the FIGS. 7a and 7c form in combination with fewer of the signals of the FIG. 7b form are used. As a specific example, forty-five percent of the pulses could be of the FIG. 7a form, forty-five percent of the pulses could be of the FIG. 7c form, and ten percent of the pulses could be of the FIG. 7b form. Moreover, the pulses of the FIGS. 7a and 7c forms are typically alternately presented to the circuit of FIG. 3 with the FIG. 7b form pulses being interspersed periodically therebetween.

When the delay through the ring oscillator 51 is considerably different from the equilibrium or reference delay, all of these test signals cause the heater counter to be counted toward the equilibrium value or reference value. This controls the heater to change the heat being applied to the integrated circuit die 22 in the appropriate manner. When the measured delay approaches the reference delay, the long test pulses of FIG. 7a will cause the heater counter 80 to be incremented and the short test pulses of FIG. 7c will cause the heater counter to be decremented. In effect, with equal numbers of long and short reference test signals, they cancel each other. In this case, only the relatively few 7b test signals with a length between the long and short forms will produce a net effect on the value in the heater counter. In this way, the number of reference test signals that have an effect is reduced as the circuit approaches equilibrium. This reduces the possibility of undesired oscillations and still provides a relatively fast overall temperature response time.

As previously mentioned, these test signals are applied by test signal source 42 to the circuit of the invention. Typically, an oscillator and a conventional divider circuit are used to provide these test pulses. Alternately, a microprocessor which counts pulses from such an oscillator and produces the mixed test pulse train of FIG. 7 may be used. The test signal source 42 is typically positioned off of the integrated circuit die 22 so that temperature changes within the die do not affect the test signals. However, a relatively temperature stable test source, such as a crystal oscillator, may be included on the integrated circuit die 22 if desired.

In operation, the circuit of FIG. 3 may be initialized by first loading the desired frequency register 60 with a zero value. Simultaneously, the heater counter 80 is loaded with a desired value, such as one that is mid-way between the minimum and maximum values. Also, heater counter 80 is inhibited from incrementing or decrementing by a disable signal on line 112. After a delay to allow the integrated circuit die temperature to stabilize, a test pulse is generated. The value that is left in frequency register 70 as a result of this test pulse may be read on a bus (not shown), negated, and saved. The negated number is then loaded as an initial reference value into the desired frequency register 60, both immediately and at any time after power to the integrated circuit may have been removed. Alternately, this output on line 114 may be monitored. In this case, desired frequency register 60 is loaded with various values, for example using an iterative binary search approach. When one value produces a signal on line 114 of one logic level and the next value causes the signal on line 114 to change levels, the one value constitutes an initial reference value. After loading the desired frequency register 60 with this initial reference value, the normal operation of the circuit of the present invention is enabled so that it commences the regulation of propagation time delays through the integrated circuit. At this time, external calibration equipment can be used to measure the delays through the integrated circuit for use in making corrections and calibration tables. These tables will remain accurate even though the power dissipation of some circuits inside the integrated circuit may change.

After these initial conditions are established, to better understand the operation of the propagation delay regulation circuit as a whole, consider the following situation. Imagine that the circuit has been operating for sometime and has reached a stable condition. However, assume that the propagation delay times on the integrated circuit have become a little too long. When a test signal is applied to the circuit, the frequency counter 70 is loaded from register 60 and the ring oscillator 51 starts. A short time later, the test signal drops to a low logic level. When this happens, the frequency counter 70 will contain a number that is equal to or near zero. Because in this example the propagation delays are slightly too large, the number will be positive. This indicates that the ring oscillator output is at too low of a frequency. At the start of the next test signal, the heater counter 80 is decremented because a positive number was left in frequency counter 70. Decrementing the heater counter 80 will reduce, slightly, the current flowing through the heater 24. Since the power being dissipated by heater 24 has been reduced slightly, the temperature of the heater will start to drop. Eventually, the temperature of the entire die 22, including the temperature of ring oscillator 51, will drop slightly. When the temperature drops, the propagation delay times will be reduced so that the original deviation in propagation delay times is corrected.

Having illustrated and described the principles of our invention with reference to one preferred embodiment, it should be apparent to those persons skilled in the art that such invention may be modified in arrangement and detail without departing from such principles. We claim as our invention all such modifications as come within the true spirit and scope of the following claims.

We claim:

1. A circuit for monitoring and controlling the propagation delay time of signals passing through an integrated circuit, the integrated circuit being of the type in which propagation delay time varies with variations in the temperature of the integrated circuit, comprising:

temperature varying means on the integrated circuit for varying the temperature of the integrated circuit; and means for sensing propagation delay time and coupled to the temperature varying means for controlling the temperature varying means to selectively vary the temperature of the integrated circuit to control the propagation delay time.

2. A circuit for monitoring and controlling the propagation delay time of signals passing through an integrated circuit, the integrated circuit being of the type in which propagation delay time varies with variations in the temperature of the integrated circuit, comprising:

a heater on the integrated circuit;

means coupled to the heater for controlling the heater to selectively heat the integrated circuit to control the propagation delay time;

delay measuring means for measuring the signal propagation delay time of signals passing through at least a portion of the integrated circuit; and the means for controlling the heater being coupled to the delay measuring means and comprising means responsive to the delay measuring means for controlling the heater to produce a first level of heating when the measured signal propagation delay time is of a first magnitude, to produce a second level of heating greater than the first level of heating when the measured signal propagation delay time is of a second magnitude which is less than the first magnitude, and to generate third level of heating less than the first level of heating and less than the second level of heating when the measured signal propagation delay time is of a third magnitude which is greater than the first magnitude and greater than the second magnitude.

3. A circuit according to claim 2 including means coupled to the means for controlling the heater for adjusting the first level of heating.

4. A circuit for monitoring and controlling the propagation delay time of signals passing through an integrated circuit, the integrated circuit being of the type in which propagation delay time varies with variations in the temperature of the integrated circuit, comprising:
   a heater on the integrated circuit;
   means coupled to the heater for controlling the heater to selectively heat the integrated circuit to control the propagation delay time;
   reference propagation delay signal means for providing a reference signal output corresponding to a reference propagation delay time;
   delay measuring means for measuring the signal propagation delay time of signals passing through at least a portion of the integrated circuit, the delay measuring means comprising means for producing a measured signal output corresponding to the measured propagation delay time;
   comparator means coupled to the reference propagation delay signal means and to the delay measuring means for comparing the reference signal output and the measured signal output and for producing a comparator output signal corresponding to the difference between the reference signal and measured signal outputs; and
   the means for controlling the heater comprising means coupled to the comparator means and responsive to the comparator output signal for controlling the heater to increase the heat provided by the heater when the measured propagation delay time is less than the reference propagation delay time and to decrease the heat provided by the heater when the measured propagation delay time is greater than the reference propagation delay time.

5. A circuit according to claim 4 including means coupled to the reference propagation delay signal means for varying the reference signal output to vary the reference propagation delay time.

6. A circuit for monitoring and controlling the propagation delay time of signals passing through an integrated circuit, the integrated circuit being of the type in which propagation delay time varies with variations in the temperature of the integrated circuit, comprising:
   a heater on the integrated circuit;
   means coupled to the heater for controlling the heater to selectively heat the integrated circuit to control the propagation delay time; and
   in which the heater comprises plural integrated circuit heat generating elements which generate heat when energized, the means for controlling the heater comprising means for controlling the energization of the heat generating elements to control the heat from the heater.

7. A circuit according to claim 6 in which the heat generating elements comprise plural MOS transistor means with different channel widths for generating heat when energized.

8. A circuit for monitoring and controlling the propagation delay time of signals passing through an integrated circuit, the integrated circuit being of the type in which propagation delay time varies with variations in the temperature of the integrated circuit, comprising:
   a heater on the integrated circuit;
   means coupled to the heater for controlling the heater to selectively heat the integrated circuit to control the propagation delay time;
   delay measuring means for measuring the signal propagation delay time of signals passing through at least a portion of the integrated circuit;
   the means for controlling the heater being coupled to the delay measuring means and comprising means responsive to the delay measuring means for controlling the heater to produce a first level of heating when the measured signal propagation delay time is of a first magnitude, to produce a second level of heating greater than the first level of heating when the measured signal propagation delay time is of a second magnitude which is less than the first magnitude, and to generate a third level of heating less than the first level of heating and less than the second level of heating when the measured signal propagation delay time is of a third magnitude which is greater than the first magnitude and greater than the second magnitude;
   test signal source means for generating propagation time delay test signals;
   the delay measuring means having a test signal input and comprising an oscillator having a gating input and N logic elements of the integrated circuit connected in series to form a ring with the output of each logic element being connected to the input of the succeeding logic element such that a pulse continuously circulates around the ring in response to a test signal delivered to the test signal input from the test signal source means applied to the gating input, the oscillator logic elements having propagation delay characteristics typical of the other logic elements on the integrated circuit, the output of the oscillator being a delay measuring signal comprised of pulses of a frequency which is a function of the propagation delay of each logic element of the ring, the propagation delay of the logic elements being in part a function of the temperature of the integrated circuit; and
   the means for controlling the heater including frequency counter means coupled to the output of the oscillator for producing a frequency counter output signal corresponding to the frequency of the delay measuring signal and also including means coupled to and responsive to the frequency counter output signal for controlling the heat from the heater means.

9. A circuit according to claim 8 in which the test signal source means comprises means for generating a stream of test signals which are not all of the same duration.

10. A circuit according to claim 8 in which the test signal source means comprises means for generating a periodic stream of test signals having first, second and third progressively increasing durations, the stream comprising multiple test signals of the first and third durations to each test signal of the second duration.

11. A circuit according to claim 10 in which the test signal source means comprises means for generating a stream of alternating test signals of the first and third duration with periodic test signals of the second durations interspersed therebetween.

12. A circuit according to claim 8 including a first storage means for storing a reference frequency value corresponding to a reference propagation delay time, the frequency counter means being coupled to the storage means and comprising means for receiving the reference frequency value from the first storage means at the start of each test signal and for decrementing the received reference frequency value in response to each pulse of the delay measuring signal, the frequency counter output signal corresponding to the value to which the reference frequency value is decremented at the end of each test signal.

13. A circuit according to claim 12 in which the means responsive to the frequency counter output signal comprises heater counter means for storing an initial heater value, the heater counter means being responsive to the frequency counter output signal for incrementing and decrementing the heater value between limits in response to the frequency counter output signal, the heater counter means comprising means for producing a heater control signal corresponding to the value to which the initial heater value is incremented and decremented in response to the frequency counter output signal, and the heater being coupled to the heater counter means to receive the heater control signal and comprising means for generating heat which varies with the heater control signal.

14. A circuit according to claim 13 including means coupled to the first storage means for varying the reference frequency value stored in the first storage means.

15. A circuit according to claim 14 including means coupled to the heater counter means for varying the initial heater value.

16. A circuit according to claim 13 in which the heater comprises plural integrated circuit heat generating elements coupled to the heater counter means and which are selectively energized in response to the heater control signal for generating heat when energized.

17. A circuit for monitoring and controlling the propagation delay time of signals passing through an integrated circuit composed of logic elements, the integrated circuit being of the type in which propagation delay time varies with variations in the temperature of the integrated circuit, comprising:

test signal source means for generating propagation time delay test signals;

delay measuring means for measuring the signal propagation delay time of signals passing through at least a portion of the integrated circuit, the delay measuring means having a test signal input and comprising an oscillator having a gating input and N logic elements of the integrated circuit connected in series to form a ring with the output of each logic element being connected to the input of the succeeding logic element such that a pulse continuously circulates around the ring in response to a test signal delivered to the test signal input from the test signal source means applied to the gating input, the oscillator logic elements having propagation delay characteristics typical of the other logic elements on the integrated circuit, the output of the oscillator being a delay measuring signal comprised of pulses of a frequency which is a function of the propagation delay of each logic element of the ring, the propagation delay of the logic elements being in part a function of the temperature of the integrated circuit;

first storage means for storing a reference frequency value corresponding to a reference propagation delay time;

means coupled to the first storage means for varying the reference frequency value stored in the first storage means;

a heater on the integrated circuit;

means coupled to the heater for controlling the heater to selectively heat the integrated circuit to control the propagation delay time, the means for controlling the heater including frequency counter means coupled to the output of the oscillator for producing a frequency counter output signal corresponding to the frequency of the delay measuring signal;

the frequency counter means comprising means coupled to the first storage means for receiving the reference frequency value from the first storage means at the start of each test signal and for decrementing the received reference frequency value in response to each pulse of the delay measuring signal, the frequency counter output signal corresponding to the value to which the reference frequency value is decremented at the end of each test signal;

means coupled to the frequency counter means and responsive to the frequency counter output signal for controlling the heat from the heater, the means responsive to the frequency counter output signal comprising heater counter means for storing an initial heater value, the heater counter means being responsive to the frequency counter output signal for incrementing and decrementing the heater value between limits in response to the frequency counter output signal, the heater counter means comprising means for producing a heater control signal corresponding to the value to which the initial heater value is incremented and decremented in response to the frequency counter output signal; and the heater being coupled to the heater counter means and comprising means for generating heat which varies with the heater control signal.

18. A circuit according to claim 17 in which the heater comprises plural integrated circuit heat generating elements coupled to the heater control means which are selectively energized in response to the heater control signal for generating heat when energized.

19. A circuit according to claim 18 in which the test signal source means comprises means for generating a periodic stream of test signals having first, second and third progressively increasing durations, the stream comprising multiple test signals of the first and third durations to each test signal of the second duration, and the circuit also including means coupled to the heater counter means for varying the initial heater value.

20. A circuit for monitoring and controlling the propagation delay time of signals passing through an integrated circuit, the integrated circuit being of the type in which propagation delay time varies with variations in the temperature of the integrated circuit, comprising:

temperature varying means on the integrated circuit for varying the temperature of the integrated circuit;

delay time sensing means for continuously sensing the propagation delay time;

means coupled to the temperature varying means and to the delay time sensing means for controlling the temperature varying means in response to the delay time sensing means to selectively vary the temperature of the integrated circuit to control the propagation delay time.

* * * * *